(12) United States Patent
Zeng

(10) Patent No.: US 10,565,935 B2
(45) Date of Patent: Feb. 18, 2020

(54) SCAN DRIVING CIRCUIT FOR OLED AND DISPLAY PANEL

(71) Applicant: Shenzhen China Star Optoelectronics Semiconductor Display Technology Co., Ltd., Shenzhen, Guangdong (CN)

(72) Inventor: Mian Zeng, Guangdong (CN)

(73) Assignee: Shenzhen China Star Optoelectronics Semiconductor Display Technology Co., Ltd, Shenzhen, Guangdong (CN)

( * ) Notice: Subject to any disclaimer, the term of this patent is extended or adjusted under 35 U.S.C. 154(b) by 108 days.

(21) Appl. No.: 15/739,771

(22) PCT Filed: Nov. 22, 2017

(86) PCT No.: PCT/CN2017/112283
§ 371 (c)(1),
(2) Date: Dec. 25, 2017

(87) PCT Pub. No.: WO2018/161432
PCT Pub. Date: Sep. 13, 2018

(65) Prior Publication Data
US 2019/0073960 A1    Mar. 7, 2019

(51) Int. Cl.
*G09G 3/3266*    (2016.01)
*H01L 27/32*    (2006.01)
*G09G 3/20*    (2006.01)

(52) U.S. Cl.
CPC ....... *G09G 3/3266* (2013.01); *H01L 27/3276* (2013.01); *G09G 2310/0264* (2013.01); *G09G 2310/08* (2013.01)

(58) Field of Classification Search
CPC .......................... G09G 3/3674; G09G 3/3677
See application file for complete search history.

(56) References Cited

U.S. PATENT DOCUMENTS 8,711,077 B2 *  4/2014  Chen .................. G11C 19/28
                                                        345/99
9,412,306 B2    8/2016  Kim
(Continued)

FOREIGN PATENT DOCUMENTS

CN       104409038 A    3/2015
CN       104900184 A    9/2015
(Continued)

*Primary Examiner* — Sepehr Azari
(74) *Attorney, Agent, or Firm* — Andrew C. Cheng

(57) ABSTRACT

A scan driving circuit for OLED and a display panel are provided. The scan driving circuit for OLED comprising a plurality of scan driving units connected in cascade. The scan driving units at each stages for receiving the stage transmission signal at previous-stage, the first scan signal at previous-stage, the first scan signal at next-stage, the first clock signal and the second clock signal, and outputting a stage transmission signal at current-stage, the first scan signal at current-stage, the second scan signal at current-stage and the third scan signal at current-stage, wherein duty cycle of the first clock signal and the second clock signal are difference. The invention could generating three types shift scanning signal required for pixel compensation circuit and solved the problem of threshold voltage drift, then reducing difference brightness of display and enhancing display effect.

19 Claims, 4 Drawing Sheets

(56) References Cited

U.S. PATENT DOCUMENTS

| | | |
|---|---|---|
| 9,716,119 B2 | 7/2017 | Li |
| 2004/0129933 A1 | 7/2004 | Nathan et al. |
| 2008/0143759 A1* | 6/2008 | Chien ................ G09G 3/3674 |
| | | 345/698 |
| 2012/0062525 A1 | 3/2012 | Kim |
| 2016/0019833 A1 | 1/2016 | Wei |
| 2016/0042693 A1 | 2/2016 | Cao |
| 2016/0358568 A1* | 12/2016 | Xiao ................ G09G 3/3674 |
| 2017/0124955 A1 | 5/2017 | Wang |

FOREIGN PATENT DOCUMENTS

| | | |
|---|---|---|
| CN | 105243995 A | 1/2016 |
| JP | 2000216406 A | 8/2000 |

* cited by examiner

SCAN DRIVING CIRCUIT FOR OLED AND DISPLAY PANEL

RELATED APPLICATIONS

The present application is a National Phase of International Application Number PCT/CN2017/112283, filed Nov. 22, 2017, and claims the priority of China Application No. 201710790166.1, filed Sep. 4, 2017.

FIELD OF THE DISCLOSURE

The disclosure relates to a display technical field, and more particularly to a scan driving circuit for OLED and a display panel.

BACKGROUND

A flat panel display possesses advantages of being ultra thin, power saved and radiation free and has been widely utilized. Present flat panel displays mainly comprise a LCD (Liquid Crystal Display) or an OLED (Organic Light Emitting Display). Comparing with LCD, the active matrix OLED (Active-matrix organic light emitting diode, AMOLED) has numbers of advantages such as power consumption, color saturation, contrast, the application of the flexible, and widely used. However, threshold voltage will be drifted when TFT be stressed and high temperature for a long period during using. According to the different display image, the threshold voltage drift in each partial of panel will be different so that cause different brightness of display. In order to solve this problem, based on the original signal to add AMOLED inside compensation signal.

SUMMARY

A technical problem to be solved by the disclosure is to provide a scan driving circuit for OLED and a display panel, which could generating three types shift scanning signal required for pixel compensation circuit and solved the problem of threshold voltage drift, then reducing difference brightness of display and enhancing display effect.

An objective of the disclosure is achieved by following embodiments. In particular, a scan driving circuit for OLED, comprising a plurality of scan driving units connected in cascade. The plurality of scan driving units comprising. A pull-up circuit for transferring an inputted first clock signal to an outputting first scan signal at current-stage. A stage transmission circuit for transferring an inputted second clock signal to an outputting stage transmission signal at current-stage. A pull-up control circuit for increasing potential of a control terminal of the pull-up circuit when scanning. A pull-down circuit for decreasing potential of the control terminal of the pull-up circuit and the outputting first scan signal at current-stage in the pull-down stage. A first pull-down holding circuit for outputting a third scan signal at current-stage. A second pull-down holding circuit for outputting a second scan signal at current-stage. The scan driving units at each stages for receiving the stage transmission signal at previous-stage, the first scan signal at previous-stage, the first scan signal at next-stage, the first clock signal and the second clock signal, and outputting the stage transmission signal at current-stage, the first scan signal at current-stage, the second scan signal at current-stage and the third scan signal at current-stage, wherein a duty cycle of the first clock signal and a duty cycle of the second clock signal are different; the duty cycle of the first clock signal is 40%, and the duty cycle of the second clock signal is 50%.

According to another aspect of the disclosure, the disclosure further provides a scan driving circuit for OLED. The scan driving units at each stages for receiving a stage transmission signal at previous-stage, a first scan signal at previous-stage, a first scan signal at next-stage, a first clock signal and a second clock signal, and outputting a stage transmission signal at current-stage, a first scan signal at current-stage, a second scan signal at current-stage and a third scan signal at current-stage, wherein a duty cycle of the first clock signal and a duty cycle of the second clock signal are different.

According to yet another aspect of the disclosure, the disclosure further provides a display panel comprises any kind of the scan driving circuit for OLED described above.

The advantageous of the invention is according to change duty cycle of the first clock signal and the second clock signal, and transfer the stage transmission signal at previous-stage, the first scan signal at previous-stage, the first scan signal at next-stage, the first clock signal and the second clock signal received by each scan driving unit to and outputting the stage transmission signal at current-stage, the first scan signal at current-stage, the second scan signal at current-stage and the third scan signal at current-stage. And generating three types shift scanning signal required for pixel compensation circuit and solved the problem of threshold voltage drift, then reducing difference brightness of display and enhancing display effect.

BRIEF DESCRIPTION OF THE DRAWINGS

Accompanying drawings are for providing further understanding of embodiments of the disclosure. The drawings form a part of the disclosure and are for illustrating the principle of the embodiments of the disclosure along with the literal description. Apparently, the drawings in the description below are merely some embodiments of the disclosure, a person skilled in the art can obtain other drawings according to these drawings without creative efforts. In the figures.

DETAILED DESCRIPTION OF PREFERRED EMBODIMENTS

The specific structural and functional details disclosed herein are only representative and are intended for describing exemplary embodiments of the disclosure. However, the disclosure can be embodied in many forms of substitution, and should not be interpreted as merely limited to the embodiments described herein.

The disclosure will be further described in detail with reference to accompanying drawings and preferred embodiments as follows.

Figure 1:
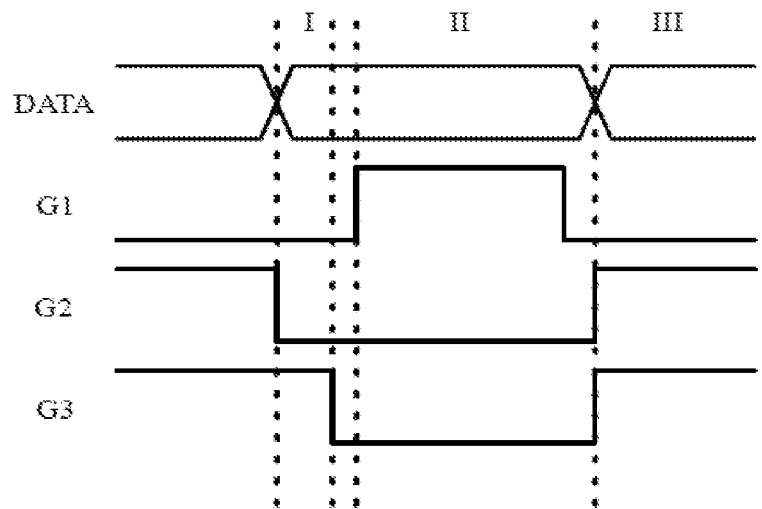
FIG. 1 is a signal clock view of compensating circuit in the art.
Figure 2:
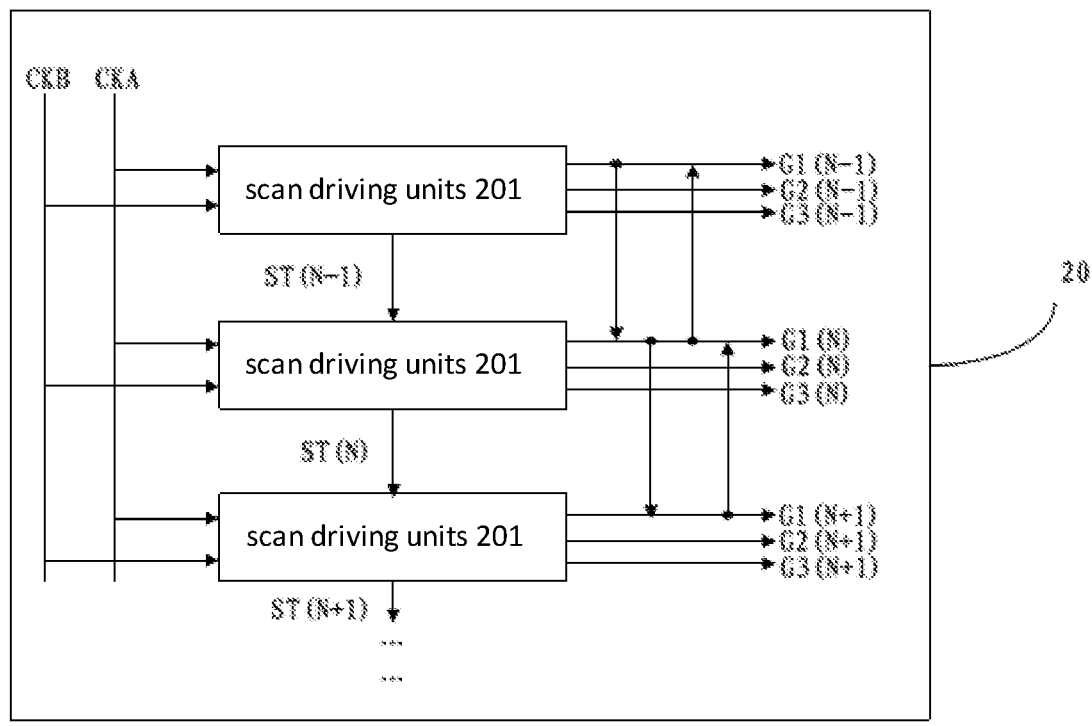
FIG. 2 is a structural schematic view of a scan driving circuit according to an embodiment of the disclosure.

Please refer to FIG. 2. FIG. 2 is a structural schematic view of a scan driving circuit according to an embodiment of the disclosure. The scan driving circuit 20 for OLED comprising a plurality of scan driving units 201 connected in cascade.

Figure 3:
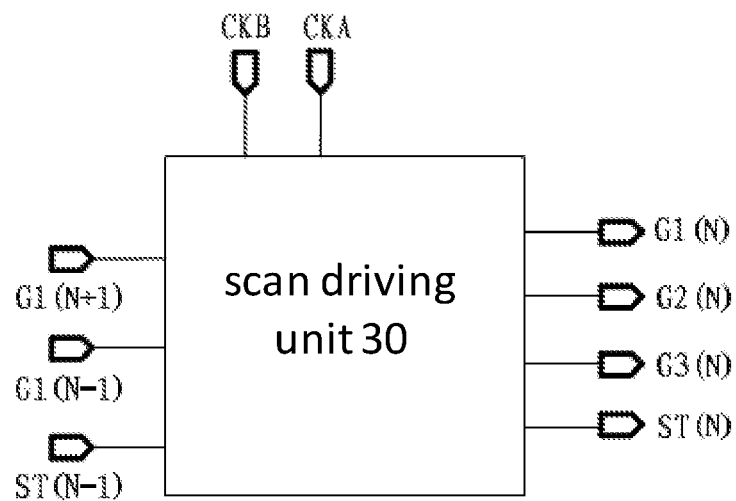
FIG. 3 is a structural schematic view of a scan driving unit according to an embodiment of the disclosure.

Please refer to FIG. 3. FIG. 3 is a circuit principle schematic view of the scan driving unit according to an embodiment of the disclosure. The plurality of scan driving units 30 for receiving a stage transmission signal at previous-stage ST(N−1), a first scan signal at previous-stage G1(N−1), a first scan signal at next-stage G1(N+1), a first clock signal CKA and a second clock signal CKB, and outputting a stage transmission signal at current-stage ST(N), a first scan signal at current-stage G1(N), a second scan signal at current-stage G2(N) and a third scan signal at current-stage G3(N). Wherein the duty cycle of the first clock signal CKA and the second clock signal CKB are different.

Selectively, duty cycle of the first clock signal is 40%, and duty cycle of the second clock signal is 50%. In other embodiment, duty cycle of the first clock signal I could be adjusted according to specifically timing of AMOLED pixel compensation signal.

Figure 4:
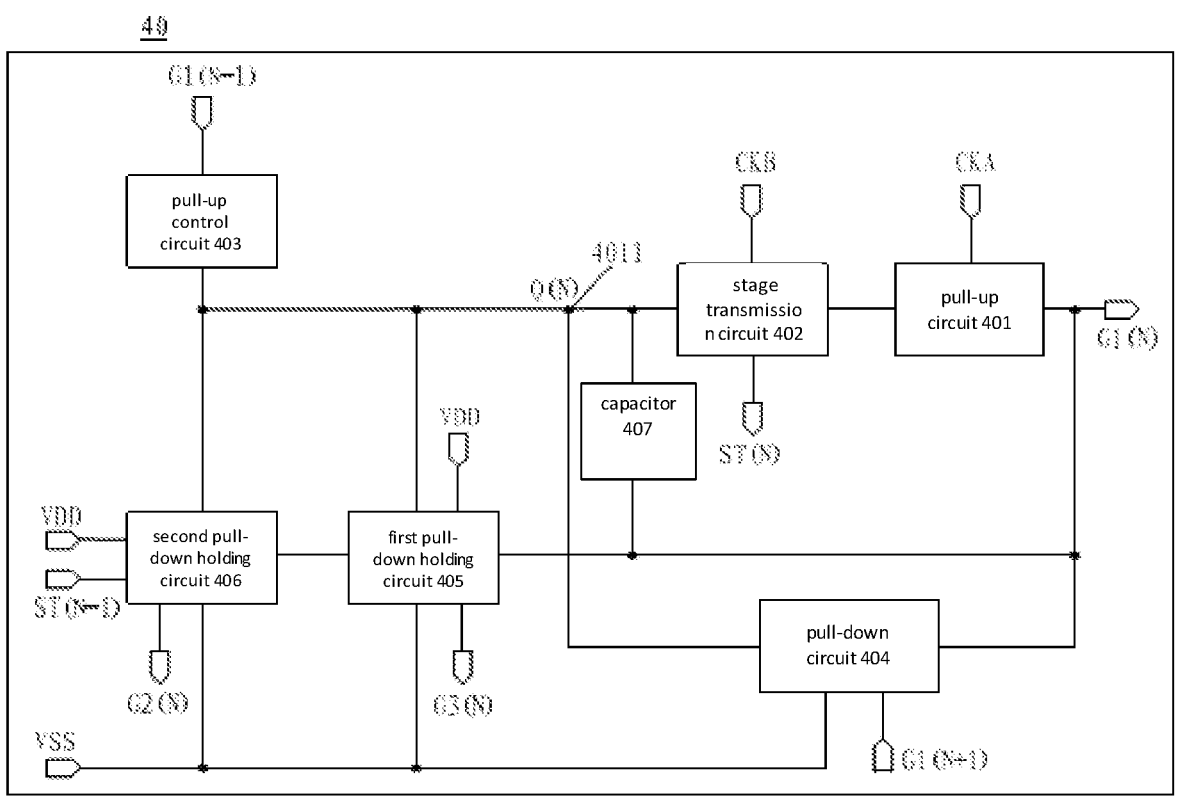
FIG. 4 is a structural schematic view of a scan driving unit according to another embodiment of the disclosure.

Please refer to FIG. 4. FIG. 4 is a structural schematic view of a scan driving unit according to another embodiment of the disclosure. In this embodiment, the scan driving unit 40 comprises a pull-up circuit 401, a stage transmission circuit 402, a pull-up control circuit 403, a pull-down circuit 404, a first pull-down holding circuit 405, a second pull-down holding circuit 406 and a capacitor 407.

The pull-up circuit 401 is for transferring an inputted first clock signal CKA to an outputting first scan signal at current-stage G1(N).

The stage transmission circuit 402 is for transferring an inputted second clock signal CKB to an outputting stage transmission signal at current-stage ST(N).

The pull-up control circuit 403 is for increasing potential of a control terminal of the pull-up circuit Q(N) when scanning.

The pull-down circuit 404 is for decreasing potential of the control terminal of the pull-up circuit Q(N) and the outputting first scan signal at current-stage G1(N) in the pull-down stage.

The first pull-down holding circuit 405 is for outputting a third scan signal at current-stage G3(N). The second pull-down holding circuit 406 is for outputting a second scan signal at current-stage G2(N).

Specifically, please refer to FIG. 4, illustrated by a first clock signal CK. The inputting signal of the pull-up circuit 401 is the first clock signal CKA, the inputting signal of the control terminal 2011 of the pull-up circuit is Q(N). The inputting signal of the stage transmission circuit 402 is the second clock signal CKB, the outputting signal is stage transmission signal at current-stage ST(N). The inputting signal of the pull-up control circuit 403 is the first scan signal at previous-stage G1(N−1), the outputting signal is for controlling potential of Q(N). The inputting signal of the pull-down circuit 404 is low level signal VSS, control terminal of the pull-down circuit 404 is the first scan signal at next-stage G1(N+1), the outputting signal is for decreasing potential of Q(N) and G1(N). The inputting signal of the first pull-down holding circuit 405 is low level signal VSS, inputting signal of the control terminal of the first pull-down holding circuit 405 is voltage signal VDD, outputting signal of the first pull-down holding circuit 405 is for continuous decreasing potential of Q(N) and G(N) at pull-down stage, at the same time, outputting the third scan signal at current-stage G3(N). The inputting signal of the second pull-down holding circuit 406 is low level signal VSS, the inputting signal of the control terminal of the second pull-down holding circuit 406 is voltage signal VDD and the stage transmission signal at previous-stage ST(N−1), outputting signal is for continuous decreasing potential of Q(N) and G(N) at pull-down stage, at the same time, outputting the second scan signal at current-stage G2(N).

At pull-up stage of circuit, potential of Q(N) is increased by the pull-up control circuit 403, the pull-up circuit 401 is transferring the first clock signal CKA to the outputting first scan signal at current-stage G1(N). At pull-down stage, the pull-down circuit 404 decreasing potential of Q(N) and G(N), the first pull-down holding circuit 405 and the second pull-down holding circuit 406 are continuous decreasing potential of Q(N) and G(N).

Further, at pull-up stage, duty cycle of the first clock signal CKA is 40% for obtaining potential of the third stage to Q(N). In other embodiment, it could also be adjusted duty cycle according to different pixel compensation signal, only needs to adjust by requirement, here is not limited thereto. At pull-down stage, when the first clock signal CKA recovers to the low potential, Q(N) point only recovers to the high potential VGH. And when turn-on the inputting first scan signal at next-stage G1(N+1) of the pull-down circuit 404, Q(N) is really be pull down to low potential. At the same time, potential Q(N) is inverted by the first pull-down holding circuit 405 and formed the outputting third scan signal at current-stage G3(N).

Further, at pull-up stage, duty cycle of the second clock signal CKB is 50% for transferring the second clock signal CKB to the stage transmission signal at current-stage ST(N) by the stage transmission circuit 402 and outputting. At the same time, the second pull-down holding circuit 406 of the circuit is decreasing potential of the second scan signal at current-stage G2(N) according to the stage transmission signal at previous-stage ST(N−1), and continuous decreasing the second scan signal at current-stage G2(N) to low potential by signal at current-stage Q(N). And forming the third scan signal at current-stage G3(N) by the stage transmission signal at previous-stage ST(N−1) and the signal at current-stage Q(N) or not.

VDD is a high potential direct current level signal VGH, and VSS is a low potential direct current level signal VGL.

According to this embodiment could generating three types shift scanning signal required for pixel compensation circuit and solved the problem of threshold voltage drift, then reducing different brightness of display and enhancing display effect.

Figure 5:
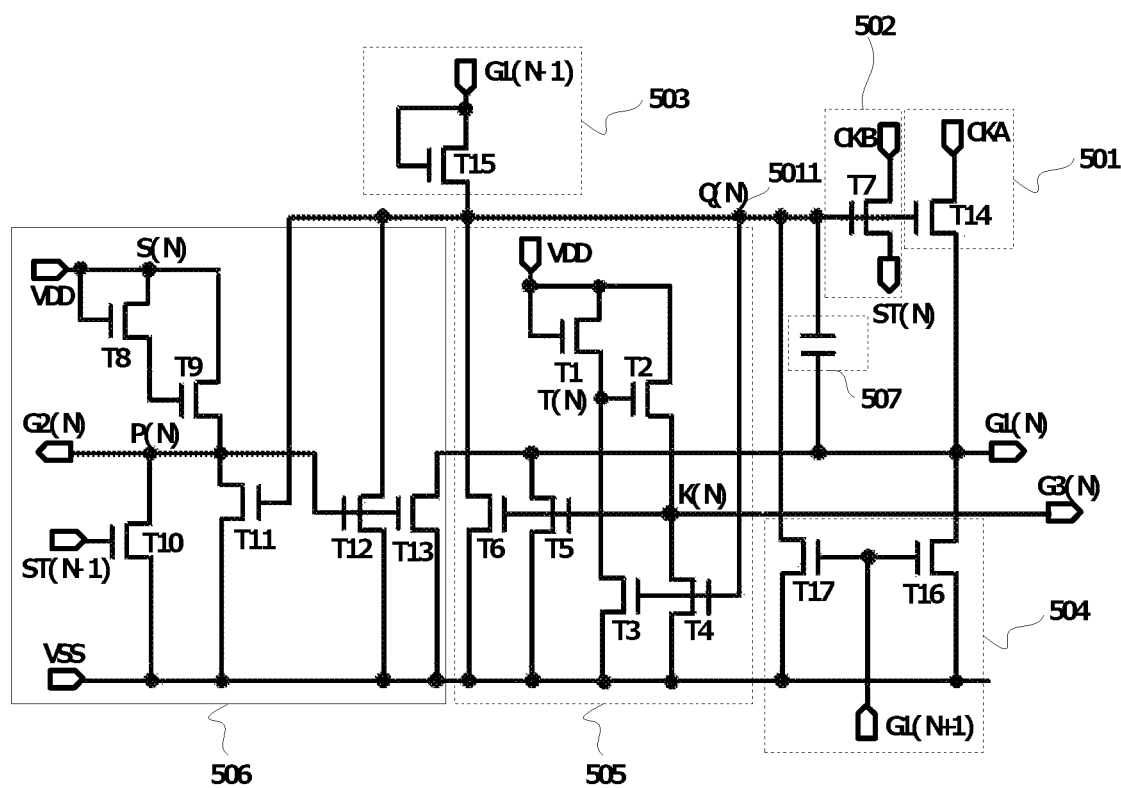
FIG. 5 is a specifically circuit schematic view of a scan driving unit according to an embodiment of the disclosure.

Please refer to FIG. 5. FIG. 5 is a specifically circuit schematic view of a scan driving unit according to an embodiment of the disclosure.

Specifically, please refer to FIG. 5. The first pull-down holding circuit 505 at least includes: a first switch T1, and a control terminal and a inputting terminal of the first switch T1 are connected a first electrical signal VDD for keeping decreases potential of the control terminal of the pull-up circuit Q(N) and the outputting first scan signal at current-stage G1(N); a second switch T2, and a control terminal of the second switch T2 is coupled to a outputting terminal of the first switch T1, an inputting terminal of the second switch T2 is coupled to an inputting terminal of the first switch T1, an outputting terminal of the second switch T2 is coupled to the second scan signal G2(N); a third switch T3, and a control terminal of the third switch T3 is coupled to the control terminal of the pull-up circuit Q(N), an inputting terminal of the third switch T3 is coupled to the control terminal of the second switch T2; a fourth switch T4, and a control terminal of the fourth switch T4 is coupled to a control terminal of the third switch T3, an inputting terminal of the fourth switch T4 is coupled to the outputting terminal of the second switch T2; a fifth switch T5, a control terminal of the fifth switch T5 is coupled to the inputting terminal of the fourth switch T4, an inputting terminal of the fifth switch T5 is coupled to the outputting first scan signal at current-stage G1(N); a sixth switch T6, a control terminal of the sixth switch T6 is coupled to a control terminal of the fifth switch T5, an inputting terminal of the sixth switch T6 is respectively coupled to the pull-up circuit 501, the pull-up control circuit 503, pull-down circuit 504 and the second pull-down holding circuit 506; an outputting terminal of the third switch T3, an outputting terminal of the fourth switch T4, an outputting terminal of the fifth switch T5 and an outputting terminal of the sixth switch T6 are connected to a second electrical signal VSS for decreasing potential of the control terminal of the pull-up circuit Q(N) and the outputting first scan signal at current-stag G(N). Wherein, the first electrical signal VDD and the second electrical signal VSS both are direct current level signal, and current level of the first electrical signal VDD is higher than the second electrical signal VSS. The first switch T1, the second switch T2, the third switch T3 and the fourth switch T4 are composited an inverter for inverting the potential of the control terminal of the pull-up circuit Q(N) to the outputting second scan signal at current-stage G2(N).

Please refer to FIG. 5. The stage transmission circuit 502 at least includes: a seventh switch T7, a control terminal of the seventh switch T7 is coupled to the control terminal of the pull-up control circuit Q(N), an inputting terminal of the seventh switch T7 is connected to the second clock signal CKB, an outputting terminal of the seventh switch T7 is connected to the stage transmission signal at current-stage ST(N). The stage transmission circuit 502 is for transferring the inputting second clock signal CKB to the outputting stage transmission signal at current-stage ST(N), and the outputting stage transmission signal at current-stage ST(N) is for providing electrical signal to the second pull-down holding circuit of the scan driving unit at next-stage.

Please refer to FIG. 5. The second pull-down holding circuit 502 at least includes: an eighth switch T8, a control terminal and an inputting terminal of the eighth switch T8 are connected to a third electrical signal VDD for continuous decreasing potential of the outputting first scan signal at current-stage G1(N) and the pull-up circuit control terminal Q(N); an ninth switch T9, a control terminal of the ninth switch T9 is coupled to an outputting terminal of the eighth switch T8, an inputting terminal of the ninth switch T9 is coupled to an inputting terminal of the eighth switch T8; a tenth switch T10, a control terminal of the tenth switch T10 is coupled to the stage transmission signal at previous-stage ST(N−1), an inputting terminal of the tenth switch T10 is coupled to the outputting third scan signal at current-stage G3(N); an eleventh switch T11, a control terminal of the eleventh switch T11 is respectively coupled to the pull-up circuit 501, the pull-up control circuit 503, the pull-down circuit 504 and the first pull-down holding circuit 505, and an inputting terminal of the eleventh switch T11 is respectively coupled to an inputting terminal of the tenth switch T10 and an outputting terminal of the ninth switch; a twelfth switch T12, a control terminal of the twelfth switch T12 is coupled to an inputting terminal of the eleventh switch T11, and inputting terminal of the twelfth switch T12 is coupled to an control terminal of the eleventh switch T11; a thirteenth switch T13, a control terminal of the thirteenth switch T13 is coupled to an inputting terminal of the twelfth switch T12, the inputting terminal of the thirteenth switch T13 is respectively coupled to an inputting terminal of the fifth switch and the outputting first scan signal at current-stage G1(N); the outputting terminal of the tenth switch T10, the outputting terminal of the eleventh switch T11, the outputting terminal of the twelfth switch T12 and the outputting terminal of the thirteenth switch T13 are connected to the second electrical signal VSS for decreasing potential of the control terminal of the pull-up circuit Q(N) and the first scan signal at current-stage G1(N); the third electrical signal VDD and the second electrical signal VSS are direct current level signal, and current level of the third electrical signal VDD is higher than the second electrical signal VSS. Wherein the third scan signal at current-stage G3(N) is formed by the potential of the control terminal of the pull-up circuit Q(N) and the stage transmission signal at previous-stage ST(N−1).

Wherein the pull-down circuit 501 at least includes: a fourteenth switch T14, a control terminal of the fourteenth switch T14 is respectively coupled to the stage transmission circuit 502, the pull-up control circuit 503, the pull-down circuit 504 and the pull-down holding circuit 505/506, an inputting terminal of the fourteenth switch T14 is connected to the first clock signal CKA, an outputting terminal of the fourteenth switch T14 is connected to the first scan signal at current-stage G1(N). Further, a bootstrap capacitor 507 is coupled between the control terminal and the outputting terminal of the fourteenth switch T14 for increasing potential of the control terminal of the fourteenth switch T14.

Further, the pull-up control circuit 503 at least includes: a fifteenth switch T15, a control terminal and an inputting terminal of the fifteenth switch T15 are connected the outputting first scan signal at previous-stage G1(N−1), and outputting terminal of the fifteenth switch T15 is respectively coupled to the control terminal of the pull-up circuit Q(N), the first pull-down holding circuit 505 and the second pull-down holding circuit 506. The pull-down circuit 504 at least includes: a sixteenth switch T16, a control terminal of the sixteenth switch T16 is connected to the outputting first scan signal at next-stage G1(N+1), an outputting terminal of the sixteenth switch T16 is respectively coupled to the pull-up circuit 501 and the first scan signal at current-stage G1(N); a seventeenth switch T17, a control terminal of the seventeenth switch T17 is coupled to the control terminal of the sixteenth switch T16 and the outputting first scan signal at next-stage G1(N+1), an inputting terminal of the seventeenth switch T17 is coupled to the control terminal of the pull-up circuit Q(N); the outputting terminal of the sixteenth switch T16 and the outputting terminal of the seventeenth switch T17 are connected to the second electrical signal VSS, the second electrical signal VSS is a low potential direct current level signal.

Figure 6:
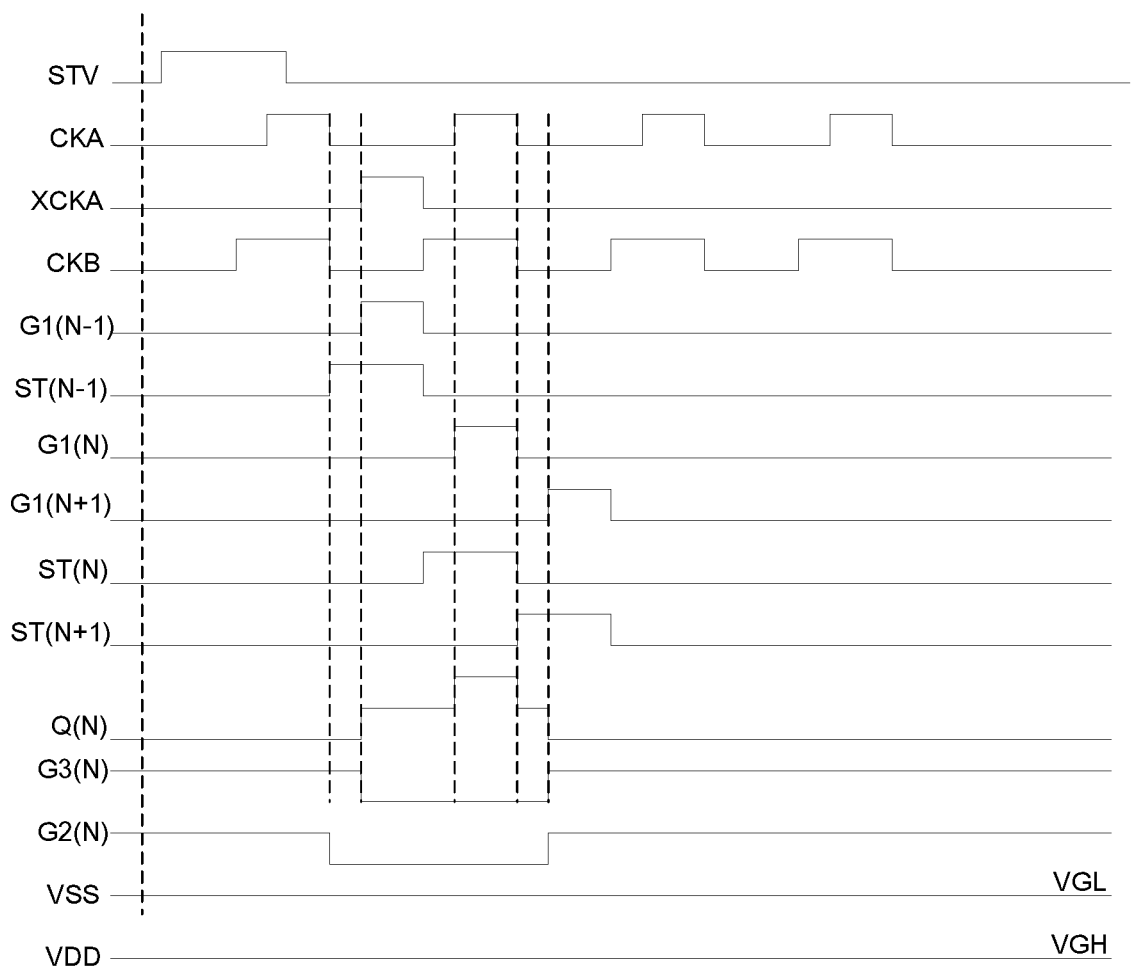
FIG. 6 is a timing diagram showing waveforms of the FIG. 5 when scanning of the disclosure.

FIG. 6 is a timing diagram showing waveforms of the FIG. 5 when scanning of the disclosure. Please refer to FIG. 5 and FIG. 6, illustrated by the first clock signal CKA and the second clock signal CKB. When the control terminal of the pull-up control circuit 503 receiving high current from the first control signal G1(N−1), the switch T15 is turn-on, the high potential current level signal VGH is increasing potential of the control terminal 5011 of the pull-up circuit 501, which is Q(N) is a high potential current level and enters to pull-up stage. At this time, turn-on the switch T14, and the first clock signal CKA is low potential current level, and the first clock signal CKA is low potential current level, the scan signal at current-stage G1(N) is low potential current level, and between two terminals of the bootstrap capacitor Cb507 has voltage difference so that bootstrap capacitor Cb507 is charging. Simultaneously, switch T7 is turn-on and the second clock signal CKB is low potential current level. When the first clock signal CKA and the second clock signal CKB becoming to be high potential current level, the first control signal G1(N−1) is become low potential current level, the switch T15 turn-off, the switch T7, T14 are turn-on, and the outputting first scan signal at current-stage G1(N) and the stage transmission signal at current-stage ST(N) are high potential current level. At this time, the bootstrap capacitor Cb507 increasing potential of the Q(N), ensuring the first clock signal CKA and the second clock signal CKB at high potential current level stage. The switch T7, T14 are both in turn-on stage such that the outputting first scan signal at current-stage G1(N) and the stage transmission signal at current-stage ST(N) are also at high potential current level stage, which the first scan signal at current-stage G1(N) is normal outputting.

At the same time, Q(N) is high potential current level at pull-up stage, the switch T3, T4, T10, T11 are turn-on, the first control point P(N), the second control point K(N), the third control point S(N) and the fourth control point T(N) are both pull-down by the low potential current level signal VSS. The switch T5, T6, T2, T13, T12, T9 are turn-of such that the first pull-down holding circuit 505 and the second pull-down holding circuit 506 will not affect potential of Q(N) and G1(N) at pull-up stage.

The first control terminal of the second pull-down holding circuit 506 inputting the second control signal VDD which is high potential current level signal, the switch T8, T9 are turn-on and the outputting second scan signal at current-stage G2(N) is high potential current level. When control terminal of the second pull-down holding circuit 506 inputting the third control signal ST(N−1) which becoming high potential current level, switch T10 is turn-on, the outputting second scan signal at current-stage G2(N) is pull-down by the low potential current level signal VSS. When Q(N) is high potential current level, the switch T11 is turn-on, the second scan signal at current-stage G2(N) is continuous pull-down by the low potential current level signal VSS. When potential of Q(N) is become decreasing, the switch T11 is turn-off, the outputting second scan signal at current-stage G2(N) is recovered to high potential current level signal. Hence, the outputting signal G2(N) of the second pull-down holding circuit 506 is become the third control signal ST(N−1) and Q(N) signal or not.

The control terminal of the first pull-down holding circuit 505 inputting the forth control signal VDD, which is high potential current level, the switch T1, T2 are turn-on, and the outputting third scan signal at current-stage G3(N) is high potential current level. When Q(N) is high potential current level, the switch T4 is turn-on, the outputting third scan signal at current-stage G3(N) is pull-down by the low potential current level signal VSS. When potential of Q(N) is become decreasing, the switch T4 is turn-off, the outputting third scan signal at current-stage G3(N) is recovered to high potential current level signal. Hence, Q(N) point passing the inverter which composited by switch T1, T2, T3 and T4, and forming an outputting signal G3(N) of the first pull-down holding circuit 505.

When the first clock signal CKA becoming low potential current level, the complementary signal XCK becoming high potential current level. The control terminal of the pull-down circuit 502 receiving the fourth control signal G1(N−1). When the fourth control signal G1(N−1) is high potential current level, the switch T16 is turn-on and enters to pull-down stage, the outputting first scan signal at current-stage G1(N) is pull-down by the low potential current level signal VSS. At this time, the bootstrap capacitor Cb507 is discharging, potential of Q(N) become decreasing. Simultaneously, switch T17 is turn-on, potential of Q(N) is pull-down by the low potential current level VSS, at this time, the pull-down holding circuit starts working. The fourth control signal VDD of the first pull-down holding circuit 505 is high potential current level, the switch T1 of the first pull-down holding circuit 505 is turn-on, and potential of fourth control point T(4) is increased, the switch T5, T6 is turn-on, and potential of the control signal Q(N) of the control terminal 5011 of the pull-up circuit 501 and the outputting first scan signal at current-stage G(1) is continuous pull-down by the low potential current level VSS. Wherein, working principle of the second pull-down holding circuit 506 is similar to the first pull-down holding circuit 505, here is not repeat again.

In above embodiment, duty cycle of the first clock signal is 40%, duty cycle of the second clock signal is 50%. Duty cycle indicated time ratio of effective level in a cycle. The occupied time of high potential current level of the first clock signal CKA is 0.4 cycle, and the occupied time of low potential current level is 0.6 cycle. Hence, the high potential current level signal of the first clock signal CKA will be relative delay to the high potential current level signal of the second clock signal CKB.

In this embodiment, all of the switches are thin-film transistor, the control terminals are gate of thin-film transistor, the inputting terminals are source of thin-film transistor, the outputting terminals are drain of thin-film transistor. Of course, in other embodiment, the inputting terminals of the switches also could be drain of thin-film transistor, and outputting terminal could be source of thin-film transistor. In addition, switches could also be other types transistor, here is not limited thereto.

Figure 7:
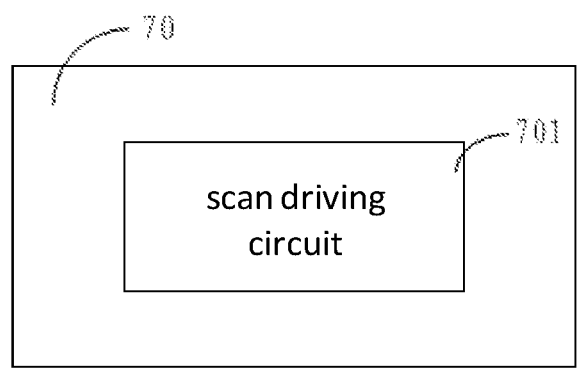
FIG. 7 is a structural schematic view of a display panel according to an embodiment of the disclosure.

Please refer to FIG. 7. FIG. 7 is a structural schematic view of a display panel according to an embodiment of the disclosure. A display panel 70 of this embodiment includes at least scan driving circuit 701. The structure and the work process of scan driving circuit 701 could refer to the scan driver unit of the FIG. 5, here is not repeat again.

The display panel of this embodiment could be a liquid crystal panel, a plasma panel and so on, here is not limited thereto.

Of course, in other embodiment, the display panel 70 further comprises TFT substrate, liquid crystal layer and some structure according to the specifically requirement, here is not limited thereto.

In this embodiment, the display panel at least includes a scan driving circuit. The scan driving circuit for OLED comprising a plurality of scan driving units connected in cascade. The scan driving units at each stages for receiving the stage transmission signal at previous-stage, the first scan signal at previous-stage, the first scan signal at next-stage, the first clock signal and the second clock signal, and outputting a stage transmission signal at current-stage, the first scan signal at current-stage, the second scan signal at current-stage and the third scan signal at current-stage, wherein duty cycle of the first clock signal and the second clock signal are different.

The foregoing contents are detailed description of the disclosure in conjunction with specific preferred embodiments and concrete embodiments of the disclosure are not limited to these description. For the person skilled in the art of the disclosure, without departing from the concept of the disclosure, simple deductions or substitutions can be made and should be included in the protection scope of the application.

What is claimed is:

1. A scan driving circuit for OLED, comprising a plurality of scan driving units connected in cascade:
the plurality of scan driving units comprising:
a pull-up circuit for transferring an inputted first clock signal to an outputting first scan signal at current-stage;
a stage transmission circuit for transferring an inputted second clock signal to an outputting stage transmission signal at current-stage;
a pull-up control circuit for increasing potential of a control terminal of the pull-up circuit when scanning;
a pull-down circuit for decreasing potential of the control terminal of the pull-up circuit and the outputting first scan signal at current-stage in the pull-down stage;
a first pull-down holding circuit for outputting a third scan signal at current-stage;
a second pull-down holding circuit for outputting a second scan signal at current-stage;
the scan driving units at each stages for receiving the stage transmission signal at previous-stage, the first scan signal at previous-stage, the first scan signal at next-stage, the first clock signal and the second clock signal, and outputting the stage transmission signal at current-stage, the first scan signal at current-stage, the second scan signal at current-stage and the third scan signal at current-stage, wherein a duty cycle of the first clock signal and a duty cycle of the second clock signal are different; the duty cycle of the first clock signal is 40%, the duty cycle of the second clock signal is 50%.

2. The scan driving circuit for OLED according to claim 1, wherein the first pull-down holding circuit at least includes:
a first switch, and a control terminal and a inputting terminal of the first switch are connected a first electrical signal for continues decreases potential of the control terminal of the pull-up circuit and the outputting first scan signal at current-stage;
a second switch, and a control terminal of the second switch is coupled to an outputting terminal of the first switch, an inputting terminal of the second switch is coupled to an inputting terminal of the first switch, an outputting terminal of the second switch is coupled to the outputting second scan signal at current-stage;
a third switch, and a control terminal of the third switch is coupled to the control terminal of the pull-up circuit, an inputting terminal of the third switch is coupled to the control terminal of the second switch;
a fourth switch, and a control terminal of the fourth switch is coupled to a control terminal of the third switch, an inputting terminal of the fourth switch is coupled to the outputting terminal of the second switch;
a fifth switch, a control terminal of the fifth switch is coupled to the inputting terminal of the fourth switch, an inputting terminal of the fifth switch is coupled to the outputting first scan signal at current-stage;
a sixth switch, a control terminal of the sixth switch is coupled to a control terminal of the fifth switch, an inputting terminal of the sixth switch is respectively coupled to the pull-up circuit, the pull-up control circuit, pull-down circuit and the second pull-down holding circuit;
the outputting terminal of the third switch, the outputting terminal of the fourth switch, the outputting terminal of the fifth switch and the outputting terminal of the sixth switch are connected to a second electrical signal for decreasing potential of the control terminal of the pull-up circuit and the outputting first scan signal at current-stage;
the first electrical signal and the second electrical signal are direct current level signal, and current level of the first electrical signal is higher than the second electrical signal.

3. The scan driving circuit for OLED according to claim 2, wherein,
the pull-up control circuit at least includes:
a fifteenth switch, a control terminal and an inputting terminal of the fifteenth switch are connected the outputting first scan signal at previous-stage, and an outputting terminal of the fifteenth switch is respectively coupled to the control terminal of the pull-up circuit, the first pull-down holding circuit and the second pull-down holding circuit;
the pull-down circuit at least includes:
a sixteenth switch, a control terminal of the sixteenth switch is connected to the outputting first scan signal at next-stage, an outputting terminal of the sixteenth switch is respectively coupled to the pull-up circuit and the first scan signal at current-stage;
a seventeenth switch, a control terminal of the seventeenth switch is coupled to the control terminal of the sixteenth switch and the outputting first scan signal at next-stage, an inputting terminal of the seventeenth switch is coupled to the control terminal of the pull-up circuit;
the outputting terminal of the sixteenth switch and the outputting terminal of the seventeenth switch are connected to the second electrical signal.

4. The scan driving circuit for OLED according to claim 1, wherein the stage transmission circuit at least includes:
a seventh switch, a control terminal of the seventh switch is coupled to the control terminal of the pull-up circuit, an inputting terminal of the seventh switch is connected to the second clock signal, an outputting terminal of the seventh switch is connected to the stage transmission signal at current-stage;
the stage transmission circuit for transferring the inputting second clock signal to the outputting stage transmission signal at current-stage, and the outputting stage transmission signal at current-stage for providing electrical signal to the second pull-down holding circuit of the scan driving unit at next-stage.

5. The scan driving circuit for OLED according to claim 1, wherein the second pull-down holding circuit at least includes:
an eighth switch, a control terminal and an inputting terminal of the eighth switch are connected to a third electrical signal for continuous decreasing potential of the outputting first scan signal at current-stage and the control terminal of the pull-up circuit;
an ninth switch, a control terminal of the ninth switch is coupled to an outputting terminal of the eighth switch, an inputting terminal of the ninth switch is coupled to the inputting terminal of the eighth switch;
a tenth switch, a control terminal of the tenth switch is coupled to the stage transmission signal at previous-stage, an inputting terminal of the tenth switch is coupled to the outputting third scan signal at current-stage;
an eleventh switch, a control terminal of the eleventh switch is respectively coupled to the pull-up circuit, the pull-up control circuit, the pull-down circuit and the first pull-down holding circuit, and an inputting terminal of the eleventh switch is respectively coupled to the inputting terminal of the tenth switch and the outputting terminal of the ninth switch;

a twelfth switch, a control terminal of the twelfth switch is coupled to an inputting terminal of the eleventh switch, and an inputting terminal of the twelfth switch is coupled to the control terminal of the eleventh switch;

a thirteenth switch, a control terminal of the thirteenth switch is coupled to the inputting terminal of the twelfth switch, the inputting terminal of the thirteenth switch is respectively coupled to the inputting terminal of the fifth switch and the outputting first scan signal at current-stage;

the outputting terminal of the tenth switch, the outputting terminal of the eleventh switch, the outputting terminal of the twelfth switch and the outputting terminal of the thirteenth switch are connected to the second electrical signal for decreasing potential of the control terminal of the pull-up circuit and the first scan signal at current-stage;

the third electrical signal and the second electrical signal are direct current level signal, and current level of the third electrical signal is higher than the second electrical signal.

6. The scan driving circuit for OLED according to claim 1, wherein the pull-up circuit at least includes:
a fourteenth switch, a control terminal of the fourteenth switch is respectively coupled to the stage transmission circuit, the pull-up control circuit, the pull-down circuit and the pull-down holding circuit, an inputting terminal of the fourteenth switch is connected to the first clock signal, an outputting terminal of the fourteenth switch is connected to the first scan signal at current-stage.

7. The scan driving circuit for OLED according to claim 6, wherein the scan driver unit further comprising: a bootstrap capacitor, the bootstrap capacitor is coupled between the control terminal and the outputting terminal of the fourteenth switch for increasing potential of the control terminal of the fourteenth switch.

8. A scan driving circuit for OLED, comprising a plurality of scan driving units connected in cascade:
the scan driving units at each stages for receiving a stage transmission signal at previous-stage, a first scan signal at previous-stage, a first scan signal at next-stage, a first clock signal and a second clock signal, and outputting a stage transmission signal at current-stage, a first scan signal at current-stage, a second scan signal at current-stage and a third scan signal at current-stage, wherein a duty cycle of the first clock signal and a duty cycle of the second clock signal are different.

9. The scan driving circuit for OLED according to claim 8, wherein the duty cycle of the first clock signal is 40%, the duty cycle of the second clock signal is 50%.

10. The scan driving circuit for OLED according to claim 8, wherein
a pull-up circuit for transferring an inputted first clock signal to an outputting first scan signal at current-stage;
a stage transmission circuit for an inputted second clock signal to an outputting stage transmission signal at current-stage;
a pull-up control circuit for increasing potential of a control terminal of the pull-up circuit when scanning;
a pull-down circuit for decreasing potential of the control terminal of the pull-up circuit and the outputting first scan signal at current-stage in the pull-down stage;
a first pull-down holding circuit for outputting a third scan signal at current-stage;
a second pull-down holding circuit for outputting a second scan signal at current-stage.

11. The scan driving circuit for OLED according to claim 10, wherein the first pull-down holding circuit at least includes:
a first switch, and a control terminal and a inputting terminal of the first switch are connected a first electrical signal for continues decreases potential of the control terminal of the pull-up circuit and the outputting first scan signal at current-stage;
a second switch, and a control terminal of the second switch is coupled to an outputting terminal of the first switch, an inputting terminal of the second switch is coupled to an inputting terminal of the first switch, an outputting terminal of the second switch is coupled to the outputting second scan signal at current-stage;
a third switch, and a control terminal of the third switch is coupled to the control terminal of the pull-up circuit, an inputting terminal of the third switch is coupled to the control terminal of the second switch;
a fourth switch, and a control terminal of the fourth switch is coupled to a control terminal of the third switch, an inputting terminal of the fourth switch is coupled to the outputting terminal of the second switch;
a fifth switch, a control terminal of the fifth switch is coupled to the inputting terminal of the fourth switch, an inputting terminal of the fifth switch is coupled to the outputting first scan signal at current-stage;
a sixth switch, a control terminal of the sixth switch is coupled to a control terminal of the fifth switch, an inputting terminal of the sixth switch is respectively coupled to the pull-up circuit, the pull-up control circuit, pull-down circuit and the second pull-down holding circuit;
the outputting terminal of the third switch, the outputting terminal of the fourth switch, the outputting terminal of the fifth switch and the outputting terminal of the sixth switch are connected to a second electrical signal for decreasing potential of the control terminal of the pull-up circuit and the outputting first scan signal at current-stage;
the first electrical signal and the second electrical signal are direct current level signal, and current level of the first electrical signal is higher than the second electrical signal.

12. The scan driving circuit for OLED according to claim 11, wherein,
the pull-up control circuit at least includes:
a fifteenth switch, a control terminal and an inputting terminal of the fifteenth switch are connected the outputting first scan signal at previous-stage, and an outputting terminal of the fifteenth switch is respectively coupled to the control terminal of the pull-up circuit, the first pull-down holding circuit and the second pull-down holding circuit;
the pull-down circuit at least includes:
a sixteenth switch, a control terminal of the sixteenth switch is connected to the outputting first scan signal at next-stage, an outputting terminal of the sixteenth switch is respectively coupled to the pull-up circuit and the first scan signal at current-stage;
a seventeenth switch, a control terminal of the seventeenth switch is coupled to the control terminal of the sixteenth switch and the outputting first scan signal at next-stage, an inputting terminal of the seventeenth switch is coupled to the control terminal of the pull-up circuit;

the outputting terminal of the sixteenth switch and the outputting terminal of the seventeenth switch are connected to the second electrical signal.

13. The scan driving circuit for OLED according to claim 10, wherein the stage transmission circuit at least includes:

a seventh switch, a control terminal of the seventh switch is coupled to the control terminal of the pull-up circuit, an inputting terminal of the seventh switch is connected to the second clock signal, an outputting terminal of the seventh switch is connected to the stage transmission signal at current-stage;

the stage transmission circuit for transferring the inputting second clock signal to the outputting stage transmission signal at current-stage, and the outputting stage transmission signal at current-stage for providing electrical signal to the second pull-down holding circuit of the scan driving unit at next-stage.

14. The scan driving circuit for OLED according to claim 10, wherein the second pull-down holding circuit at least includes:

an eighth switch, a control terminal and an inputting terminal of the eighth switch are connected to a third electrical signal for continuous decreasing potential of the outputting first scan signal at current-stage and the control terminal of the pull-up circuit;

an ninth switch, a control terminal of the ninth switch is coupled to an outputting terminal of the eighth switch, an inputting terminal of the ninth switch is coupled to the inputting terminal of the eighth switch;

a tenth switch, a control terminal of the tenth switch is coupled to the stage transmission signal at previous-stage, an inputting terminal of the tenth switch is coupled to the outputting third scan signal at current-stage;

an eleventh switch, a control terminal of the eleventh switch is respectively coupled to the pull-up circuit, the pull-up control circuit, the pull-down circuit and the first pull-down holding circuit, and an inputting terminal of the eleventh switch is respectively coupled to the inputting terminal of the tenth switch and the outputting terminal of the ninth switch;

a twelfth switch, a control terminal of the twelfth switch is coupled to an inputting terminal of the eleventh switch, and an inputting terminal of the twelfth switch is coupled to the control terminal of the eleventh switch;

a thirteenth switch, a control terminal of the thirteenth switch is coupled to the inputting terminal of the twelfth switch, the inputting terminal of the thirteenth switch is respectively coupled to the inputting terminal of the fifth switch and the outputting first scan signal at current-stage;

the outputting terminal of the tenth switch, the outputting terminal of the eleventh switch, the outputting terminal of the twelfth switch and the outputting terminal of the thirteenth switch are connected to the second electrical signal for decreasing potential of the control terminal of the pull-up circuit and the first scan signal at current-stage;

the third electrical signal and the second electrical signal are direct current level signal, and current level of the third electrical signal is higher than the second electrical signal.

15. The scan driving circuit for OLED according to claim 10, wherein the pull-up circuit at least includes:

a fourteenth switch, a control terminal of the fourteenth switch is respectively coupled to the stage transmission circuit, the pull-up control circuit, the pull-down circuit and the pull-down holding circuit, an inputting terminal of the fourteenth switch is connected to the first clock signal, an outputting terminal of the fourteenth switch is connected to the first scan signal at current-stage.

16. The scan driving circuit for OLED according to claim 15, wherein the scan driver unit further comprising: a bootstrap capacitor, the bootstrap capacitor is coupled between the control terminal and the outputting terminal of the fourteenth switch for increasing potential of the control terminal of the fourteenth switch.

17. A display panel comprises a scan driving circuit for OLED, the scan driving circuit for OLED comprising a plurality of scan driving units connected in cascade:

the scan driving units at each stages for receiving a stage transmission signal at previous-stage, a first scan signal at previous-stage, a first scan signal at next-stage, a first clock signal and a second clock signal, and outputting a stage transmission signal at current-stage, a first scan signal at current-stage, a second scan signal at current-stage and a third scan signal at current-stage, wherein a duty cycle of the first clock signal and a duty cycle of the second clock signal are different.

18. The display panel according to claim 17, wherein the duty cycle of the first clock signal is 40%, the duty cycle of the second clock signal is 50%.

19. The display panel according to claim 17, wherein a pull-up circuit for transferring an inputted first clock signal to an outputting first scan signal at current-stage;

a stage transmission circuit for an inputted second clock signal to an outputting stage transmission signal at current-stage;

a pull-up control circuit for increasing potential of a control terminal of the pull-up circuit when scanning;

a pull-down circuit for decreasing potential of the control terminal of the pull-up circuit and the outputting first scan signal at current-stage in the pull-down stage;

a first pull-down holding circuit for outputting a third scan signal at current-stage;

a second pull-down holding circuit for outputting a second scan signal at current-stage.

* * * * *